US012610720B2

(12) United States Patent
Li et al.

(10) Patent No.: US 12,610,720 B2
(45) Date of Patent: Apr. 21, 2026

(54) DISPLAY PANEL AND PRODUCING METHOD THEREOF, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Yuekang Li, Beijing (CN); Long Chen, Beijing (CN); Tiancheng Yu, Beijing (CN); Bing Liao, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 702 days.

(21) Appl. No.: 17/921,524

(22) PCT Filed: Nov. 2, 2021

(86) PCT No.: PCT/CN2021/128137
§ 371 (c)(1),
(2) Date: Oct. 26, 2022

(87) PCT Pub. No.: WO2023/077260
PCT Pub. Date: May 11, 2023

(65) Prior Publication Data
US 2024/0224736 A1 Jul. 4, 2024

(51) Int. Cl.
*H10K 59/80* (2023.01)
*H10K 59/38* (2023.01)

(52) U.S. Cl.
CPC ......... *H10K 59/877* (2023.02); *H10K 59/878* (2023.02); *H10K 59/38* (2023.02)

(58) Field of Classification Search
CPC ..... H10K 59/877; H10K 59/878; H10K 59/38
See application file for complete search history.

(56) References Cited

U.S. PATENT DOCUMENTS

2014/0183462 A1 7/2014 Lee et al.
2015/0077966 A1 3/2015 Bessho et al.
(Continued)

FOREIGN PATENT DOCUMENTS

CN 105700051 A 6/2016
CN 109192758 A 1/2019
(Continued)

OTHER PUBLICATIONS

Yu-shi Zhang, et al. "Light scattering intensity calculation of metal sphere microparticle." Journal of Shandong University of Technology (Natural Science Edition), vol. 21, No. 4. Jul. 2007.

*Primary Examiner* — Eric K Ashbahian
(74) *Attorney, Agent, or Firm* — IPro, PLLC

(57) ABSTRACT

The display panel includes: a substrate and a base plate that face each other; a plurality of light emitting units that are arranged in an array, wherein the light emitting units are arranged between substrate and base plate; and a plurality of scattering components that are arranged in an array, wherein the scattering components are disposed on light exiting sides of the light emitting units, each of the scattering components includes at least one scattering unit, the scattering unit includes a matrix and a plurality of scattering particles that are disposed on one side of the matrix, and particle sizes of the scattering particles and distances between orthographic projections of the scattering particles on the substrate and a center projection satisfy a relation of positive correlation, wherein the center projection refers to an orthographic projection of a center of each of the light emitting units on the substrate.

20 Claims, 6 Drawing Sheets

(56)     References Cited

U.S. PATENT DOCUMENTS

| | | | |
|---|---|---|---|
| 2016/0291216 A1* | 10/2016 | Lee .................... | G02B 5/0263 |
| 2016/0372528 A1* | 12/2016 | Kamura ............... | H10K 30/87 |
| 2018/0182940 A1* | 6/2018 | Yamamoto ........... | F21V 7/0083 |
| 2020/0209678 A1* | 7/2020 | Hsu .................... | G02F 1/133504 |
| 2021/0047235 A1* | 2/2021 | Kanungo ............. | G02B 6/0065 |
| 2022/0052118 A1* | 2/2022 | Kim .................... | H10K 59/38 |
| 2023/0189609 A1* | 6/2023 | Wu ..................... | H10K 59/877 |
| | | | 257/40 |
| 2024/0298499 A1* | 9/2024 | Kang .................. | H10K 50/844 |

FOREIGN PATENT DOCUMENTS

| | | | |
|---|---|---|---|
| CN | 110429161 A | 11/2019 |
| CN | 111029480 A | 4/2020 |
| CN | 111403446 A | 7/2020 |
| CN | 111430570 A | 7/2020 |
| CN | 112289906 A | 1/2021 |
| CN | 113241364 A | 8/2021 |
| JP | 2016162578 A | 9/2016 |

* cited by examiner

DISPLAY PANEL AND PRODUCING METHOD THEREOF, AND DISPLAY DEVICE

TECHNICAL FIELD

The present application relates to the technical field of displaying and, more particularly, to a display panel and a producing method thereof, and a display device.

BACKGROUND

With the continuous development of the television industry, high-color-gamut display screens have already become a dominant trend of the development of the television industry. Display screens using QLED (Quantum Dot Light Emitting Diodes) having the characteristic of electroluminescence do not only have the advantage of a wide color gamut, but also have many advantages such as a high brightness, a high response speed and a good effect of HDR (High-Dynamic Range), and therefore they have a very extensive prospect of application. However, such display screens have a low luminous efficiency, and require further optimization.

SUMMARY

The embodiments of the present application employ the following technical solutions:

In an aspect, there is provided a display panel, wherein the display panel comprises:

a substrate;

a plurality of light emitting units that are disposed on the substrate and are arranged in an array, wherein the light emitting units are arranged between the substrate and the base plate; and a plurality of scattering components that are arranged in an array, wherein the scattering components are disposed on light exiting sides of the light emitting units, each of the scattering components comprises at least one scattering unit, the scattering unit comprises a matrix and a plurality of scattering particles that are disposed on one side of the matrix, and particle sizes of the scattering particles and distances between orthographic projections of the scattering particles on the substrate and a center projection satisfy a relation of positive correlation, wherein the center projection refers to an orthographic projection of a center of each of the light emitting units on the substrate.

Optionally, the particle sizes of the scattering particles are D, and the distances between the orthographic projections of the scattering particles on the substrate and the center projection are x, wherein D and x satisfy:

$$f(x, D) = 1 - \exp\left[-\frac{x^2}{2D^2}\right];$$

wherein $f(x,D)$ is a particle-distribution-density function.

Optionally, in the scattering unit, the orthographic projections of the plurality of scattering particles on the substrate are distributed in a concentric circle with the center projection as a center.

Optionally, among the orthographic projections of the plurality of scattering particles on the substrate, distances between neighboring concentric circles progressively decrease in a direction from close to the center projection to away from the center projection.

Optionally, in the scattering unit, the plurality of scattering particles whose orthographic projections on the substrate are located in a same one circle are equidistantly distributed.

Optionally, one side of the matrix comprises a plurality of openings of different depths and different sizes, and the scattering particles are disposed within the corresponding openings.

Optionally, in the scattering unit, refractive indexes of the plurality of scattering particles are equal.

Optionally, each of the scattering components comprises the plurality of scattering units that are arranged in layer configuration; and in a light exiting direction of the light emitting unit, the refractive indexes of the scattering particles of the plurality of scattering units progressively increase.

Optionally, each of the scattering components comprises the plurality of scattering units that are arranged in layer configuration; and along a light exiting direction of the light emitting unit, refractive indexes of the matrixes of the plurality of scattering units progressively increase.

Optionally, the display panel further comprises a plurality of reflecting parts and a plurality of defining parts, the defining parts are arranged between neighboring instances of the light emitting units, and the reflecting parts are arranged on at least sides of the defining parts that contact the light emitting units.

Optionally, each of the light emitting units comprises a quantum-dot luminescent layer.

Optionally, the plurality of light emitting units are configured to emit a same initial-wave-band light; and the display panel further comprises a plurality of quantum-dot color converting units, and the quantum-dot color converting units are arranged on light exiting sides of the light emitting units, and are configured to convert the incident initial-wave-band light into a target-wave-band light.

Optionally, the display panel further comprises a plurality of transmitting units, and the transmitting units are arranged on the light exiting sides of the light emitting units, and are configured not to change a wave band of the incident initial-wave-band light; and the quantum-dot color converting units and the transmitting units correspond to different light emitting units.

Optionally, the quantum-dot color converting units and the transmitting units are arranged between corresponding light emitting units and corresponding scattering components.

Optionally, each of the scattering components comprises the plurality of scattering units that are arranged in layer configuration; and along a light exiting direction of the light emitting unit, refractive indexes of the matrixes of the plurality of scattering units progressively increase.

Optionally, the quantum-dot color converting units and the transmitting units are further configured to be used as the matrixes of the corresponding scattering components; and the scattering particles are arranged on sides of the quantum-dot color converting units and the transmitting units that are away from the light emitting units.

Optionally, in the plurality of light emitting units, any one of some of the light emitting units is correspondingly provided with the plurality of quantum-dot color converting units, and any one of the other light emitting units is correspondingly provided with the plurality of transmitting units;

the scattering particles are arranged on all of the sides of the quantum-dot color converting units and the transmitting units that are away from the light emitting units; and in a light exiting direction of the light emitting unit, refractive indexes of the plurality of quantum-dot color converting units that correspond to the same one light emitting unit are equal, and refractive indexes of the plurality of transmitting units that correspond to the same one light emitting unit are equal.

In another aspect, there is provided a display device, wherein the display device comprises the display panel stated above.

In yet another aspect, there is provided a method for producing the display panel stated above, wherein the method comprises:

forming the plurality of light emitting units; and forming the plurality of scattering components, wherein the scattering components are disposed on light exiting sides of the light emitting units, each of the scattering components comprises at least one scattering unit, the scattering unit comprises a matrix and a plurality of scattering particles that are disposed on one side of the matrix, and particle sizes of the scattering particles and distances between orthographic projections of the scattering particles on the substrate and a center projection satisfy a relation of positive correlation, wherein the center projection refers to an orthographic projection of a center of each of the light emitting units on the substrate.

Optionally, one side of the matrix comprises a plurality of openings of different depths, and the scattering particles are disposed within the corresponding openings; and the step of forming the plurality of scattering components comprises:

forming a matrix film;

ablating a surface of one side of the matrix film by laser interference, to form the matrix having a plurality of openings of different depths and different sizes; and sputtering the scattering particles into the openings.

The above description is merely a summary of the technical solutions of the present application. In order to more clearly know the elements of the present application to enable the implementation according to the contents of the description, and in order to make the above and other purposes, features and advantages of the present application more apparent and understandable, the particular embodiments of the present application are provided below.

BRIEF DESCRIPTION OF THE DRAWINGS

In order to more clearly illustrate the technical solutions of the embodiments of the present application or the prior art, the figures that are required to describe the embodiments or the prior art will be briefly introduced below. Apparently, the figures that are described below are embodiments of the present application, and a person skilled in the art may obtain other figures according to these figures without paying creative work.

DETAILED DESCRIPTION

In order to make the objects, the technical solutions and the advantages of the embodiments of the present application clearer, the technical solutions of the embodiments of the present application will be clearly and completely described below with reference to the drawings of the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

In the embodiments of the present application, terms such as "first" and "second" are used to distinguish identical items or similar items that have substantially the same functions and effects, merely in order to clearly describe the technical solutions of the embodiments of the present application, and should not be construed as indicating or implying the degrees of importance or implicitly indicating the quantity of the specified technical features. Furthermore, the meaning of "plurality of" is "two or more", and the meaning of "at least one" is "one or more", unless explicitly and particularly defined otherwise.

Figure 6:
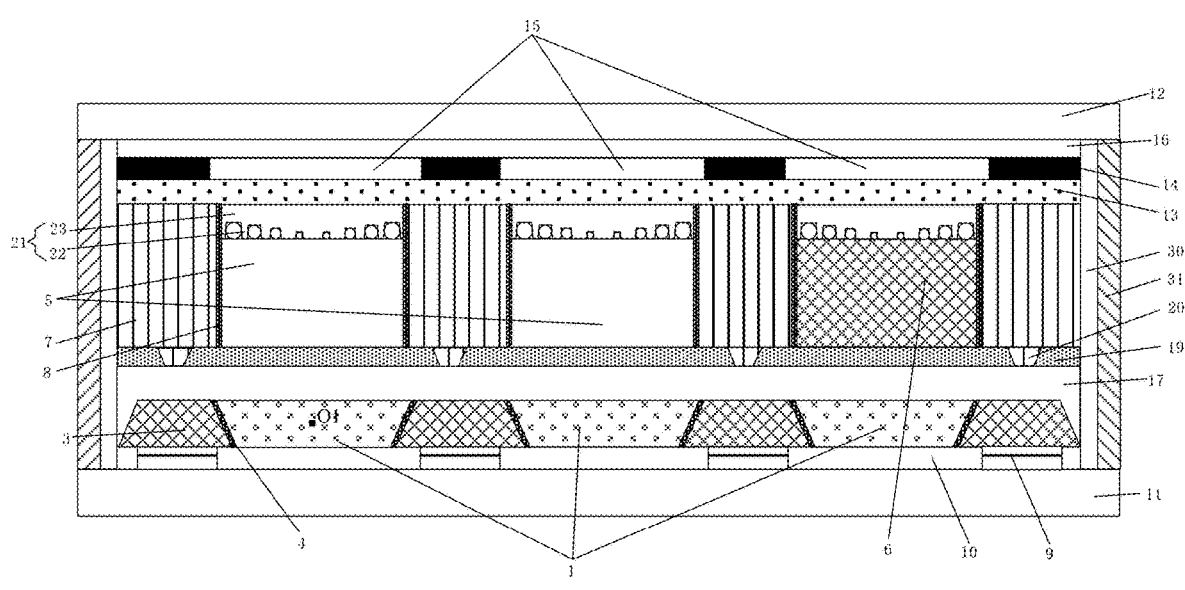
Figure 7:
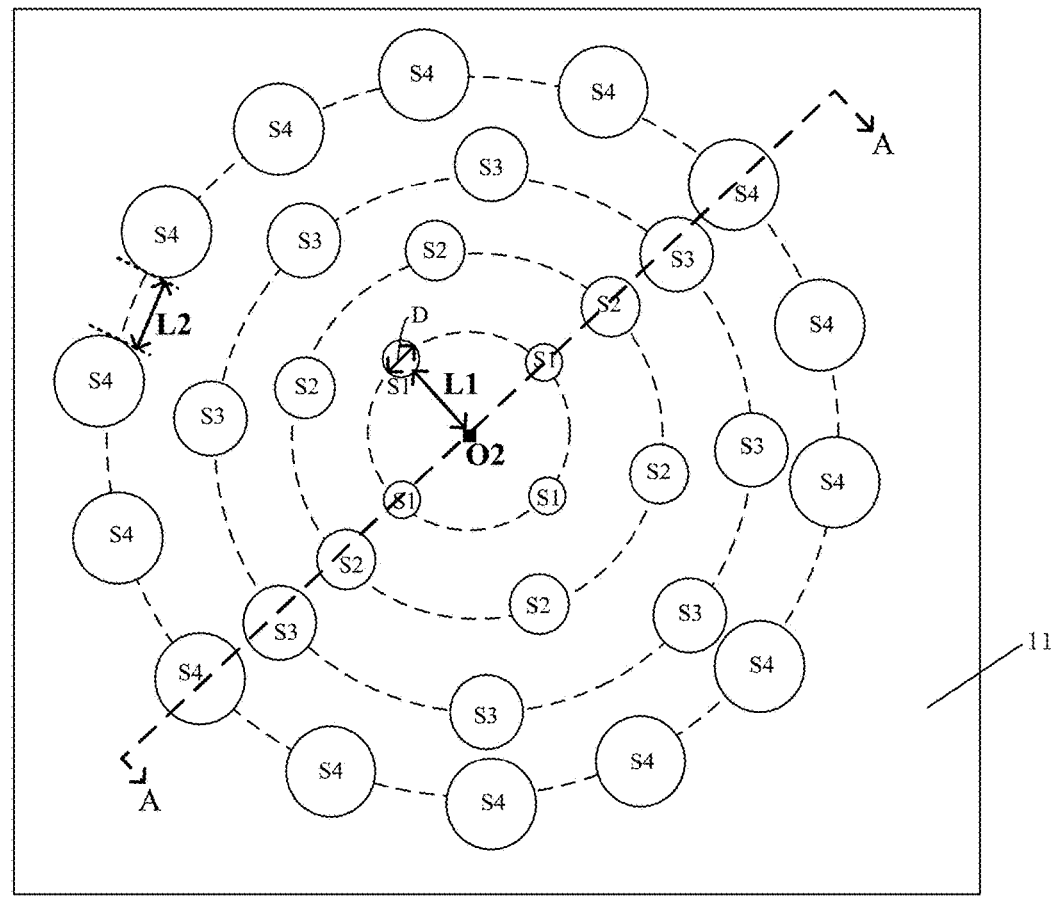
FIG. 7 schematically shows a schematic structural diagram of the scattering particles.

An embodiment of the present application provides a display panel. Referring to FIGS. 3-6, the display panel comprises:

a substrate 11, wherein the material of the substrate is not limited, and, as an example, the material of the substrate may be rigid, for example, glass, and may also be flexible, for example, polyimide (PI) and so on;

a plurality of light emitting units 1 that are disposed on the substrate 11 and are arranged in an array; and a plurality of scattering components that are arranged in an array (not marked in FIGS. 3-6), wherein the scattering components are disposed on the light exiting sides of the light emitting units 1, each of the scattering components comprises at least one scattering unit 21, the scattering unit 21 comprises a matrix 22 and a plurality of scattering particles 23 that are disposed on one side of the matrix 22, and referring to FIG. 7, the particle sizes D of the scattering particles and the distances L1 between the orthographic projections of the scattering particles on the substrate 11 and a center projection O2 satisfy a relation of positive correlation, wherein the center projection O2 refers to the orthographic projection of the center O1 of each of the light emitting units 1 on the substrate 11.

In order to define the plurality of light emitting units, the display panel may further comprise a plurality of defining parts 3, opening regions are disposed between neighboring defining parts 3, and the light emitting units 1 are disposed within the opening regions. The particular structure of the light emitting units is not limited. As an example, each of the light emitting units may comprise a first electrode, a luminescent layer and a second electrode. The center of the light emitting unit may be selected according to the structure. As an example, the center of the light emitting unit may be the center of the luminescent layer. Alternatively, referring to FIGS. 3-6, the center of the light emitting unit may also be the center O1 of the opening region. The shape and the size of the opening region directly influence the shape and the size of the light emitting unit, and in turn influence the shape and the size of the sub-pixel. The shape of the cross section of the opening region in the direction parallel to the substrate is not limited herein. As an example, the shape may be a rectangle, a rhombus, an ellipse and so on. Furthermore, the shape of the cross section of the opening region in the direction perpendicular to the substrate is not limited herein. As an example, the shape may be a rectangle, a trapezoid and so on.

In order to facilitate the description, the distance between the orthographic projection of a scattering particle on the substrate and the center projection is referred to as a first distance. That the particle sizes of the scattering particles and the first distances satisfy a relation of positive correlation refers to that, referring to FIG. 7, the particle sizes D of the scattering particles increase with the increasing of the first distances L1, or the particle sizes of the scattering particles decrease with the decreasing of the first distances. Accordingly, the particle sizes of the particles progressively decrease from the edge positions to the center positions, and the particle sizes of the scattering particles corresponding to the center region of the light emitting unit (for example, the scattering particles marked with S1 in the figures) are less than the particle sizes of the scattering particles corresponding to the edge region of the light emitting unit (for example, the scattering particles marked with S4 in the drawings). In other words, the particle sizes of the edge particles are higher, and the particle sizes of the center particles are lower.

The sizes of the scattering particles are of a nanometer scale, and therefore they may also be referred to as nano-sized scattering particles. The particle sizes may range 30 nm-180 nm. The scattering to the light rays by the nano-sized scattering particles is Rayleigh scattering, and it may be known according to the model of Rayleigh scattering that, in the nanometer scale, if the particle radii are larger, the Rayleigh-scattering effect is more intensive. In the display panel according to the present application, the particle sizes of the scattering particles and the first distances satisfy a relation of positive correlation. Accordingly, the particle sizes of the scattering particles corresponding to the center region of the light emitting unit are lower (for example, the particle sizes are 30 nm), and the scattering effect is weaker, which facilitates the direct transmission of the light rays. The particle sizes of the scattering particles corresponding to the edge region of the light emitting unit are higher (for example, the particle sizes are 180 nm), and the scattering effect is more intensive, which facilitates the convergence of the light rays to the center, thereby increasing the light output rate and the direct-visual-angle light emission.

The material of the scattering particles may be an inorganic material, for example, any one or combination of silicon dioxide, titanium dioxide, zirconium dioxide, vanadium dioxide, stannic dioxide, aluminium oxide and barium titanate, and may also be an organic material, for example, any one or combination of silicone, polystyrene and polycarbonate. Those are not limited herein, and may be selected according to actual demands.

The shape of the scattering particles is not limited. As an example, the shape of the scattering particles may be a sphere, a spheroid, a cube and so on. In order to produce to analyze the scattering path, and reduce the difficulty in designing and production, spherical scattering particles may be used. All of the figures of the embodiments of the present application are illustrated by taking spherical scattering particles as an example. When the scattering particles are spherical, the particle sizes of the scattering particles refer to the diameters. If the scattering particles are of another shape, the particle sizes of the scattering particles may refer to the dimensions of the scattering particles.

In some embodiments, the scattering particles are hollow particles. The hollow particles may be spherical, and have a core-shell structure, which, particularly, comprises a core part and a shell part. If the diameters of the hollow particles are higher, the amount of the gas layer filling the core part is higher, and the refractive index of the scattering unit filled with the hollow particles is lower.

The matrix may be produced by using a transmitting material. As an example, an amorphous material that may be vapor-deposited may be used, and, certainly, another transmitting material may also be used, which is not limited herein. The thickness of the matrix in the direction perpendicular to the substrate is not limited, and generally a micrometer-scale thickness is employed.

The structure of the light emitting unit is not limited. As an example, the light emitting unit may comprise a luminescent layer. The material of the luminescent layer is not limited herein, and it may be an organic luminescent material or a quantum-dot material. In order to increase the luminous efficiency, the light emitting unit may further comprise an electron transporting layer and a hole transporting layer that are located on the two sides of the luminescent layer. In order to further increase the injection efficiency of electrons and holes, the light emitting unit may further comprise an electron injection layer located on the side of the electron transporting layer that is away from the luminescent layer and a hole injection layer located on the side of the hole transporting layer that is away from the luminescent layer. The light emitting unit may emit blue light, and may also emit UV ultraviolet light and so on, which is not limited herein.

Figures 1, 2, 3:
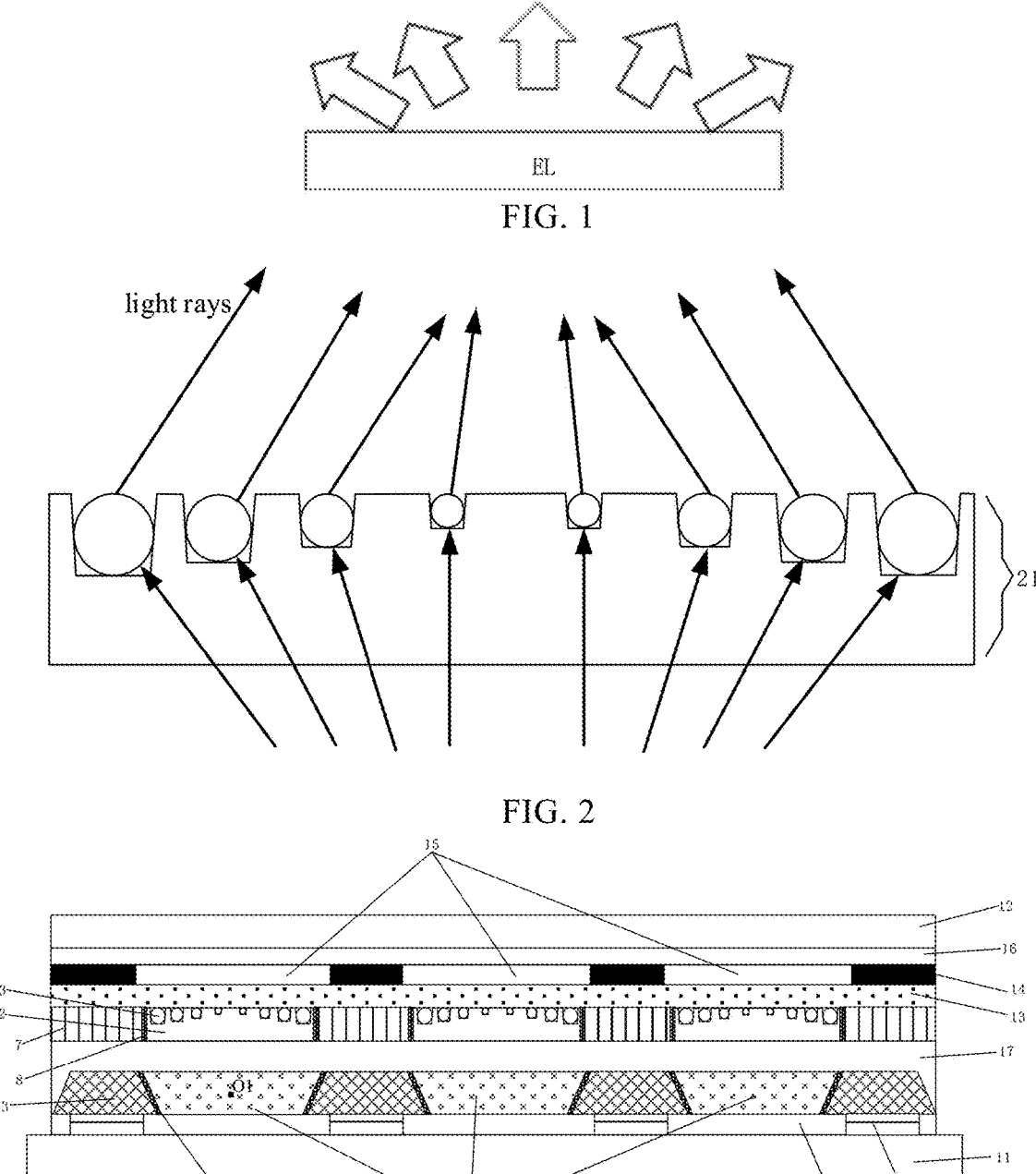
FIG. 1 schematically shows a diagram of the emergence of the light rays of the electroluminescent layer.
FIG. 2 schematically shows an optical-path diagram obtained after the light rays have passed through the scattering unit.
FIGS. 3-6 schematically show schematic structural diagrams of four types of the display panels.
Figures 4, 5:
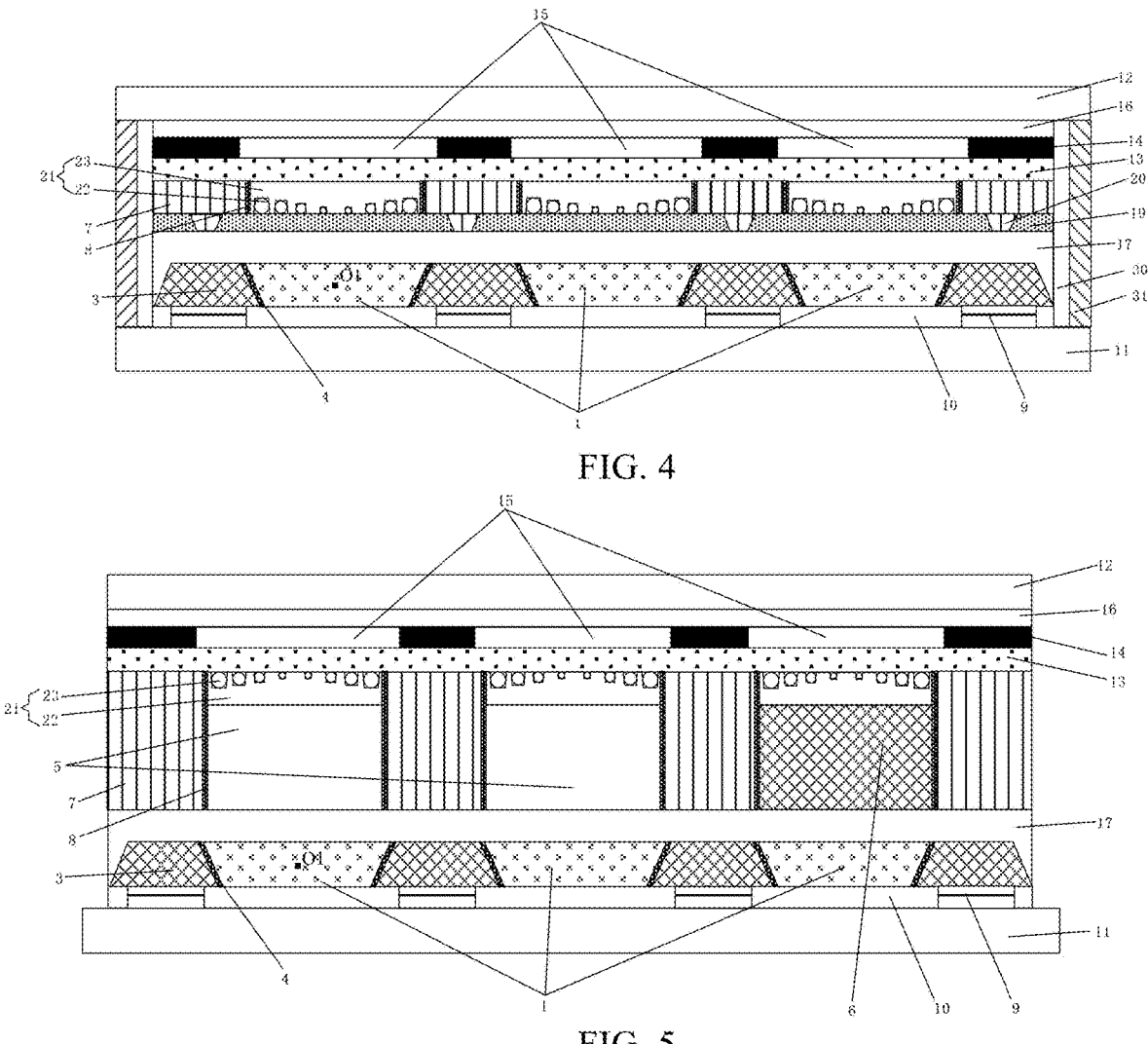

The display panel may be applied to the QLED display panel shown in FIGS. 3 and 4, in which case the light emitting unit may comprise a quantum-dot luminescent layer. The quantum dot (QD) is a nanocrystal particle, has a radius less than or close to the exciton Bohr radius, and usually has a size between 1 nm and 20 nm. The quantum dot has the function of quantum restriction, and emits fluorescence when excited. The quantum dot has unique luminescence characteristics, for example a wide excitation peak width, a narrow emission peak and a regulatable luminescence spectrum, and high-purity spectra of different colors may be obtained by regulating the size of the quantum dot. Furthermore, the quantum dot is an inorganic substance, and has a more stable operating state, a longer life and a lower cost. However, referring to FIG. 1, the light exiting angles of the electroluminescent layer (EL) are scattered, and the photon extraction rate and the intensity of the direct-visual-angle light emission are required to be further optimized. In the present application, by disposing the scattering components, referring to FIG. 2, the photon extraction rate and the intensity of the direct-visual-angle light emission may be greatly increased.

Alternatively, the display panel may also be applied to the QD-OLED display panel shown in FIGS. 5 and 6. In this case, the light emitting unit may comprise a blue-light organic luminescent layer, and the display panel may further comprise a quantum-dot color converting layer. The QD-OLED display panel combines the blue-light OLED (Organic Light Emitting Diode) and the QD (Quantum Dot), and after the blue light emitted by the blue-light organic luminescent layer has passed through the quantum-dot color converting layer, red light or green light may be obtained, thereby realizing color displaying.

The process for producing the display panel is not limited. As an example, the display panel may be formed by using a matching process (for example, the display panel shown in FIGS. 4 and 6). The display panel may further comprise a base plate, and the substrate and the base plate face each other. Particularly, referring to FIGS. 4 and 6, the process may comprise producing film layers such as the light emitting units 1 on the substrate 11 to form a first base plate, on the base plate 12, producing sequentially film layers such as a black matrix 14, a color-film layer (comprising color-film units 15) and the plurality of scattering components (comprising the scattering units 21) to form a second base plate, and subsequently the first base plate and the second base plate being arranged in align with each other to form the display panel. Alternatively, the display panel may also be formed by using an On-EL process (for example, the display panel shown in FIGS. 3 and 5). Particularly, referring to FIGS. 3 and 5, the process may comprise producing sequentially film layers such as the light emitting units 1, the plurality of scattering components (comprising the scattering units 21), a black matrix 14 and a color-film layer (comprising color-film units 15) on the substrate 11, and subsequently forming a cover plate by using the base plate 12, to form the display panel.

It should be noted that the display panel may further comprise components such as the black matrix 14 and the color-film layer (comprising color-film units 15) shown in FIGS. 3-6. Merely the components that are relevant to the inventiveness are described herein, and the other components are not described in detail.

In the display panel according to the present application, by regulating the particle-size distribution of the scattering particles, the particle sizes of the particles from the edge positions to the center positions progressively decrease, and the particle sizes of the scattering particles corresponding to the center region of the light emitting unit are less than the particle sizes of the scattering particles corresponding to the edge region of the light emitting unit. Accordingly, the particle sizes of the scattering particles corresponding to the center region of the light emitting unit are lower, and the scattering effect is weaker, which facilitates the direct transmission of the light rays. The particle sizes of the scattering particles corresponding to the edge region of the light emitting unit are higher, and the scattering effect is more intensive, which, referring to FIG. 2, facilitates the convergence of the light rays to the center, thereby increasing the light output rate and the direct-visual-angle light emission. Furthermore, the scattering unit comprises a matrix and a plurality of scattering particles that are disposed on one side of the matrix, whereby the surface of the side of the scattering unit that is provided with the scattering particles is uneven, which destroys the smoothness of the film layers, and reduces the probability of specular reflection, thereby further increasing the light output rate.

Optionally, the particle sizes of the scattering particles are D, and the distances between the orthographic projections of the scattering particles on the substrate and the center projection are x, wherein D and x satisfy:

$$f(x, D) = 1 - \exp\left[-\frac{x^2}{2D^2}\right];$$

wherein $f(x,D)$ is a particle-distribution-density function.

If the distribution density of the scattering particles satisfies $f(x,D)$, then the distribution density of the scattering particles corresponding to the edge region of the light emitting unit is greater than the distribution density of the scattering particles corresponding to the center region of the light emitting unit. Accordingly, referring to FIG. 7, the scattering particles corresponding to the center region of the light emitting unit have a lower distribution density, and lower particle sizes, and therefore they have no obvious influence on the direct-visual-angle light emission. By contrast, the scattering particles corresponding to the edge region of the light emitting unit have a higher distribution density, and higher particle sizes, and therefore they have a very strong effect of scattering to the light rays in the side visual angles. Therefore, at least 30% of the light rays in the side visual angles enter the path of the direct-visual-angle light emission, thereby further increasing the brightness of the direct-visual-angle light emission.

Figure 15:
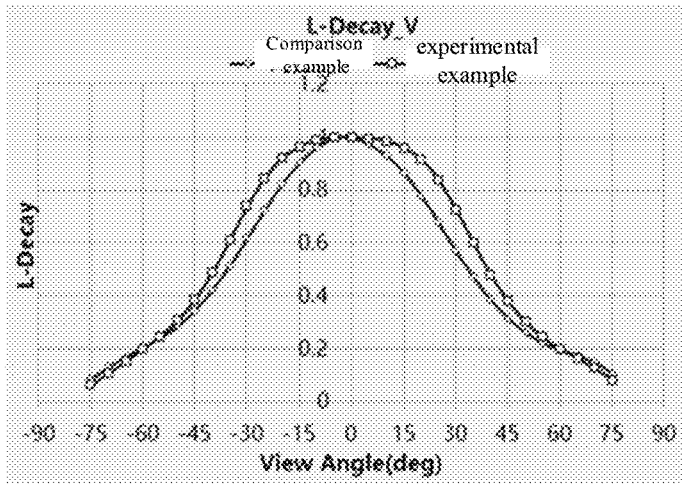
FIG. 15 schematically shows a diagram of a measurement result.

A green-light monochromatic QLED device is used as the simulating sample, the structure of the device is shown in FIG. 3, the material of the scattering particles is titanium dioxide, and the particle-size distribution density satisfies $f(x,D)$. By using simulation test, the test graph shown in FIG. 15 may be obtained. In FIG. 15, the horizontal coordinate represents the light exiting angle (View Angle) with the unit of degree (deg), and the vertical coordinate represents the normalized light intensity. Furthermore, the structure corresponding to the experimental example is provided with the scattering components, and the structure corresponding to the comparison example is not provided with the scattering components. It may be found by the comparison that the light exiting angles of the experimental example are greater than the light exiting angles of the comparison example, which indicates that the luminous efficiency of the device has been effectively improved.

It should be noted that, according to the situations of the different sub-pixels, the 20) distribution density of the scattering particles may be further optimized, thereby obtaining distribution-density functions that are different from $f(x,D)$.

Optionally, in order to further increase the light output rate, referring to FIG. 7, in the scattering unit, the orthographic projections of the plurality of scattering particles on the substrate 11 are distributed in a concentric circle with the center projection O2 as the center.

Referring to FIG. 7, the particle sizes of the plurality of scattering particles that are located in the same one circle are equal. Furthermore, if closer to the center, the particle sizes of the scattering particles are lower, and the distribution density is lower. If away from the center, the particle sizes of the scattering particles are higher, and the distribution density is higher. FIG. 7 illustrates by taking 4 concentric circles as an example, wherein the particles that belong to the same one circle are marked with the same one letter, and the scattering particles in the 4 circles are marked with S1, S2, S3 and S4.

Figure 8:
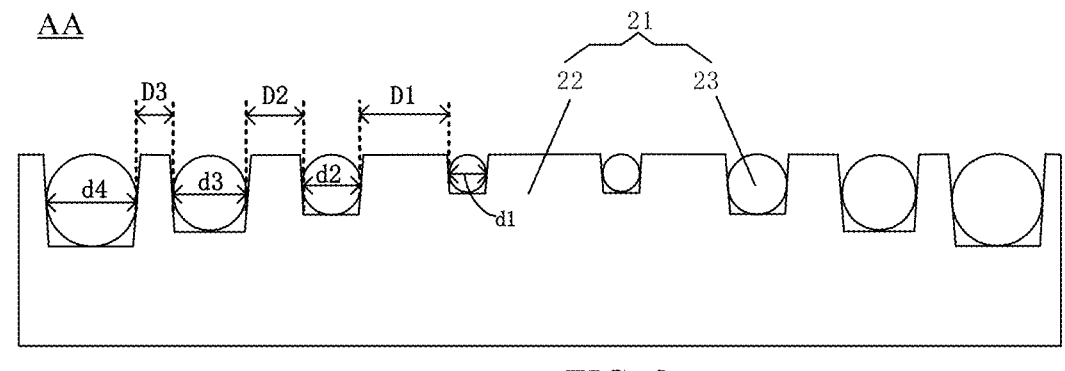
FIG. 8 is a cross-sectional view along AA in FIG. 7.

In one or more embodiments, in order to ensure that the density of the scattering particles closer to the center is less than the density of the scattering particles away from the center, referring to FIGS. 7 and 8, among the orthographic projections of the plurality of scattering particles on the substrate, the distances between neighboring concentric circles progressively decrease in the direction from close to the center projection to away from the center projection. In FIG. 8, D3 is less than D2, D2 is less than D1, d4 is greater than d3, d3 is greater than d2, and d2 is greater than d1.

In one or more embodiments, in order to increase the uniformity of the outputted light, to further increase the luminous efficiency, in the scattering unit, the plurality of scattering particles whose orthographic projections on the substrate are located in the same one circle are equidistantly distributed. Referring to FIG. 7, in the same one circle, all of the distances L2 between the neighboring scattering particles are equal.

Figure 9:
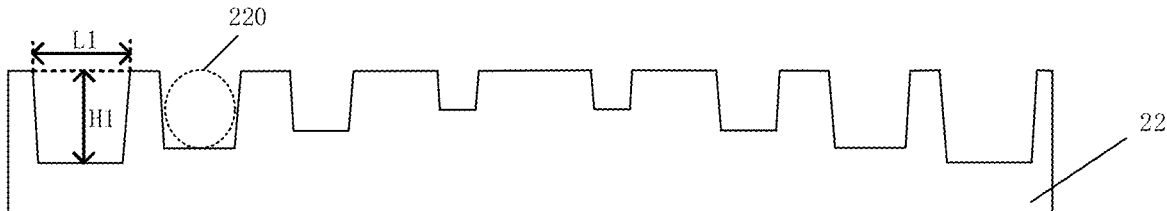
FIG. 9 schematically shows a structural diagram of the matrix of the scattering unit.

In one or more embodiments, referring to FIGS. 8 and 9, one side of the matrix 22 comprises a plurality of openings 220 of different depths (H1) and different sizes (L1), and the scattering particles 23 are disposed within the corresponding openings 220.

In the scattering unit, the scattering particles are embedded within the openings at the surface of the matrix, whereby the distribution of the scattering particles may be controlled by controlling the distribution of the openings, which has a high controllability and is easy to implement.

Certainly, the particular structures of the matrix and the scattering particles in the scattering unit are not limited to the above. As an example, referring to FIG. 11, the scattering particles 23 may also be directly disposed on one side of the matrix 22, and the matrix is not required to be provided with the openings. In such a structure, in order to better fix the scattering particles, the scattering unit is further required to be provided with a fixing unit. The fixing unit is not limited herein. The fixing unit may fix the scattering particles based on magnetic adsorption or electric adsorption, and its particular structure may be obtained by referring to the related art.

In one or more embodiments, in the scattering unit, the refractive indexes of the plurality of scattering particles are equal. Accordingly, the plurality of scattering particles may be produced by using the same material, thereby simplifying the producing process, and reducing the producing cost. Moreover, that facilitates the designing of the optical path.

Figure 10:
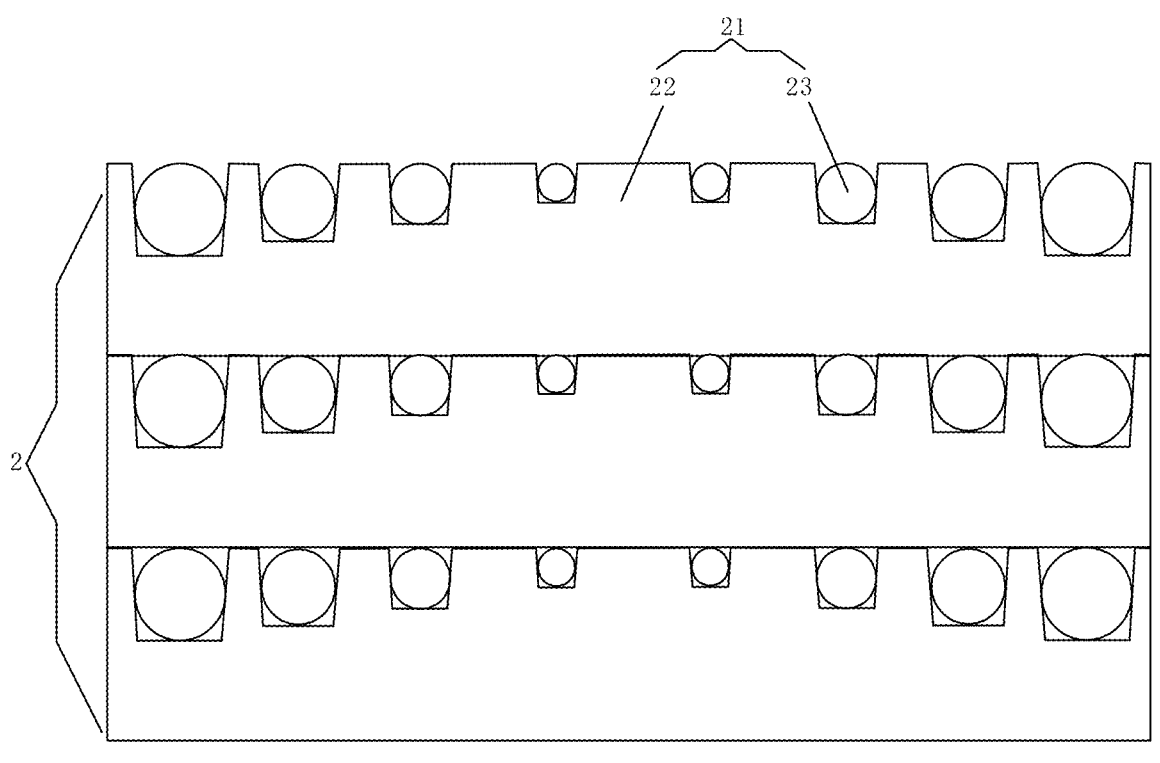
FIG. 10 schematically shows a schematic structural diagram of the scattering components.
Figures 11, 12:
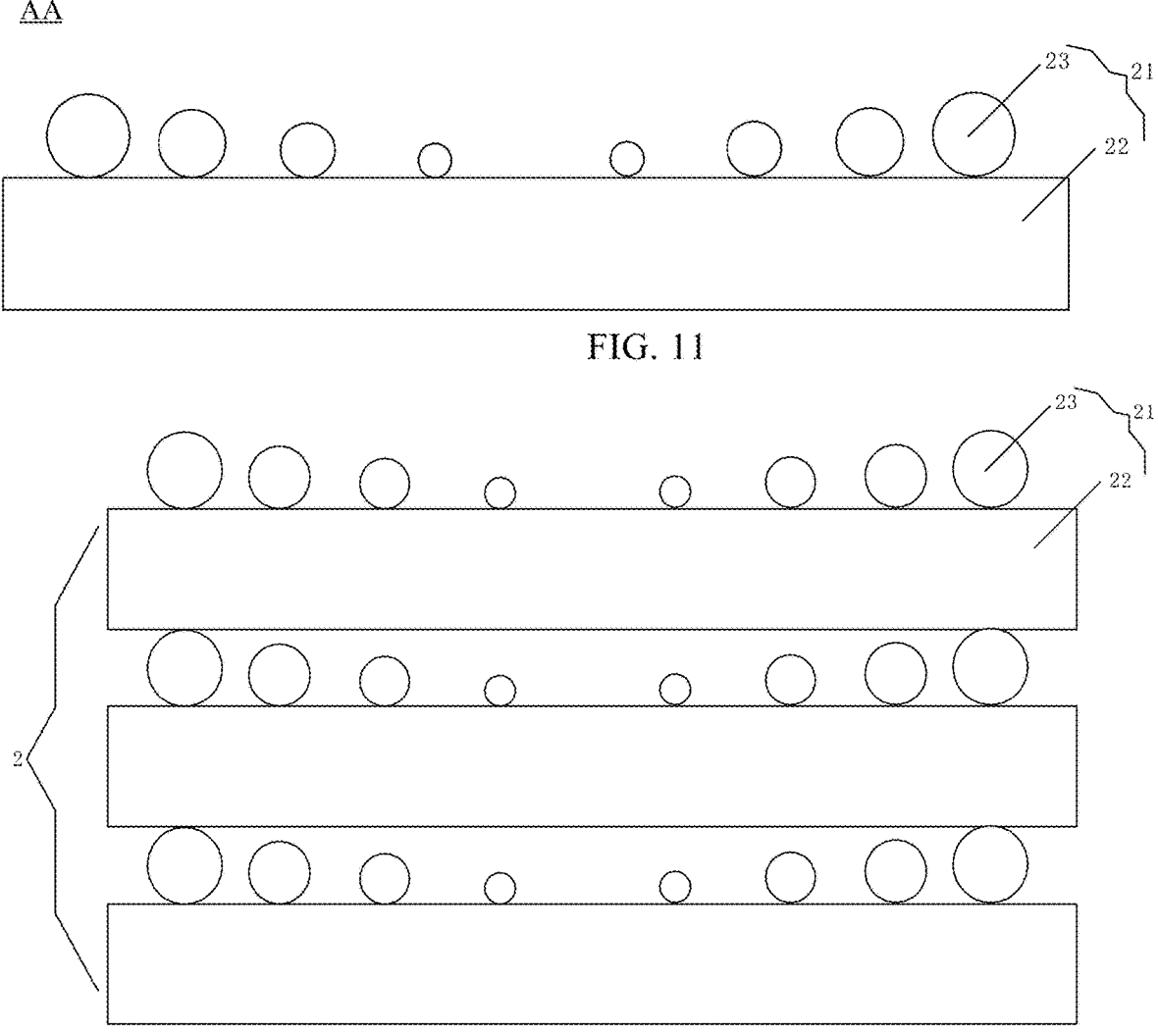
FIG. 11 is another cross-sectional view along AA in FIG. 7.
FIG. 12 schematically shows a schematic structural diagram of another scattering components.

Optionally, referring to FIGS. 10 and 12, each of the scattering components 2 comprises a plurality of scattering units 21 that are arranged in layer configuration. Along the light exiting direction of the light emitting unit, the refractive indexes of the scattering particles 23 of a plurality of scattering units 21 progressively increase.

In other words, in the same one scattering unit, the refractive indexes of the plurality of scattering particles are equal. Regarding the plurality of scattering units that are arranged in layer configuration, the scattering particles of the scattering units that are closer to the light emitting units have a lower refractive index, and the scattering particles of the scattering units that are further from the light emitting units have a higher refractive index, which further facilitates the convergence of the light rays to the center, to further increase the luminous efficiency.

In one or more embodiments, referring to FIGS. 10 and 12, each of the scattering components 2 comprises a plurality of scattering units 21 that are arranged in layer configuration. In the light exiting direction of the light emitting unit, the refractive indexes of the matrixes 22 of a plurality of scattering units 21 progressively increase.

In other words, in the plurality of scattering units that are arranged in layer configuration, the matrixes of the scattering units that are closer to the light emitting units have a lower refractive index, and the matrixes of the scattering units that are further from the light emitting units have a higher refractive index, which further facilitates the convergence of the light rays to the center, to further increase the luminous efficiency.

In one or more embodiments, referring to FIGS. 3-6, the display panel further comprises a plurality of reflecting parts 4 and a plurality of defining parts 3, the defining parts 3 are arranged between neighboring light emitting units 1, and the reflecting parts 4 are arranged on at least the sides of the defining parts 3 that contact the light emitting units 1.

The defining parts may prevent the neighboring light emitting units from influencing each other, thereby reducing the risk of cross-color, and increasing the displaying contrast. The shape of the cross section of the defining parts in the direction perpendicular to the substrate may be a regular trapezoid, an inverted trapezoid, a rectangle and so on, all of the figures of the embodiments of the present application illustrate by taking a regular trapezoid as an example.

If the reflecting parts have a larger area, the effect of reflection is better. That the reflecting parts are arranged on at least the sides of the defining parts that contact the light emitting units comprises: the reflecting parts are arranged on the one side of the defining parts that contacts the light emitting units; or, referring to FIGS. 3-6, the reflecting parts are arranged on at least two sides of the defining parts that contact the light emitting units; or, all of the sides of the defining parts that contact the light emitting units are provided with the reflecting parts. That is not limited herein, and may be selected according to actual situations.

The material of the reflecting parts is not limited, and its reflectivity may be set to be at least 80% (for example, 80%-95%). When the lights of the light emitting units are emitted to the reflecting parts, they are reflected back into the light emitting units, which may change the paths of the light rays emitted to the reflecting parts, and extend the optical paths of that part of the light rays, thereby increasing the utilization ratio of that part of the light rays.

In one or more embodiments, referring to FIGS. 3 and 4, each of the light emitting units 1 comprises a quantum-dot luminescent layer (not shown). The display panel may be applied to a QLED display panel. The structure of the QLED display panel may refer to FIGS. 3 and 4. Certainly, the panel may further comprise components such as a black matrix and a color-film layer.

In one or more embodiments, referring to FIGS. 5 and 6, the plurality of light emitting units are configured to emit a same initial-wave-band light. The display panel further comprises a plurality of quantum-dot color converting units 5, and the quantum-dot color converting units 5 are arranged on the light exiting sides of the light emitting units 1, and are configured to convert the incident initial-wave-band light into a target-wave-band light.

The particular wave bands of the initial-wave-band light and the target-wave-band light are not limited. As an example, the wave band of the initial-wave-band light may be 450-480 nm, and the light within the wave band is blue light. The wave band of the target-wave-band light may be 622-760 nm, and the light within the wave band is red light. Alternatively, the wave band of the target-wave-band light may also be 500-560 nm, and the light within the wave band is green light. The plurality of quantum-dot color converting units may convert the initial-wave-band light into the same one target-wave-band light. Alternatively, the plurality of quantum-dot color converting units may also convert the initial-wave-band light into different target-wave-band lights. As an example, the plurality of quantum-dot color converting units are grouped into two groups, wherein one of the groups convert the initial-wave-band light into one target-wave-band light (for example, red light), and the other of the groups convert the initial-wave-band light into another target-wave-band light (for example, green light). In QD-OLED display panels, usually the red-light wave band and the green-light wave band are selected to serve as the target-wave-band light, the blue-light wave band are selected to serve as the initial-wave-band light, the plurality of quantum-dot color converting units are classified into red-color converting units and green-color converting units, the red-color converting units are configured to convert the blue-light wave band into the red-light wave band (i.e., converting blue light into red light), and the green-color converting units are configured to convert the blue-light wave band into the green-light wave band (i.e., converting blue light into green light). FIGS. 5 and 6 illustrate by taking the case as an example in which the quantum-dot color converting units on the left are the red-color converting units and the quantum-dot color converting units on the right are the green-color converting units.

The relative position relation between the quantum-dot color converting units and the scattering components is not limited herein. As an example, the scattering components may be arranged on merely the sides of the quantum-dot color converting units that are away from the light emitting units. Alternatively, the scattering components may be arranged on merely the sides of the quantum-dot color converting units that are closer to the light emitting units. Alternatively, the scattering components may be arranged on the sides of the quantum-dot color converting units that are away from the light emitting units and the sides of the quantum-dot color converting units that are closer to the light emitting units.

The display panel may be applied to a panel combining OLED and QD, to combine the advantages of OLED and QD. The present application, by disposing the scattering components, may increase the light output rate of such a type of display panels.

Further optionally, referring to FIGS. 5 and 6, the display panel further comprises a plurality of transmitting units 6, and the transmitting units 6 are arranged on the light exiting sides of the light emitting units 1, and are configured not to change the wave band of the incident initial-wave-band light. The quantum-dot color converting units 5 and the transmitting units 6 correspond to different light emitting units.

The transmitting units may be transmissive to the incident light, wherein wave-band conversion does not happen. As an example, if the initial-wave-band light is blue light, then the blue light may pass through the transmitting units, is not converted into lights of other wave bands such as red light, and may be directly used for blue-color displaying. The transmitting units may be light diffusing units, so that the incident lights are scattered without changing the wavelength, which facilitates uniform displaying. The light diffusing units may be produced by using a light diffusing resin or transmitting resin that has the capacity of light diffusion, so that the incident light rays are more uniform after passing through the light diffusing units. In the present application, the transmission refers to transmission that allows the lights to change the angles but not to have wave-band conversion.

Certainly, the transmitting units may modulate the darkness of the color of the incident lights. As an example, if the incident light is of a deep blue color, then, after modulated by the transmitting units, it is converted into a light blue color, wherein both of the wave bands of the incident light and the converted light belong to the blue-light wave band.

A particular structure of the quantum-dot color converting units, the transmitting units and the scattering components will be provided below.

Referring to FIGS. 5 and 6, the quantum-dot color converting units 5 and the transmitting units 6 are arranged between the corresponding light emitting units 1 and the corresponding scattering components (comprising the scattering unit 21).

Accordingly, the initial-wave-band lights emitted by the light emitting units, after converted by the quantum-dot color converting units or the transmitting units, emit to the scattering components. After the light rays have passed through the quantum-dot color converting units or the transmitting units, the light exiting angles are scattered, and the light output rate is low. By disposing the scattering components, the light rays emitted out of the quantum-dot color converting units or the transmitting units are modulated, the light rays may be converged to the center to the largest extent, thereby increasing the light output rate and the direct-visual-angle light emission.

Further optionally, referring to FIG. 10, each of the scattering components 2 comprises a plurality of scattering units 21 that are arranged in layer configuration. Along the light exiting direction of the light emitting unit, the refractive indexes of the matrixes 22 of a plurality of scattering units 21 progressively increase.

Accordingly, the incident light rays may also be modulated by the matrixes of the plurality of scattering units, which may enable more light rays to be converged to the center, thereby further increasing the light output rate and the direct-visual-angle light emission.

Another particular structure of the quantum-dot color converting units, the transmitting units and the scattering components will be provided below.

Figure 13:
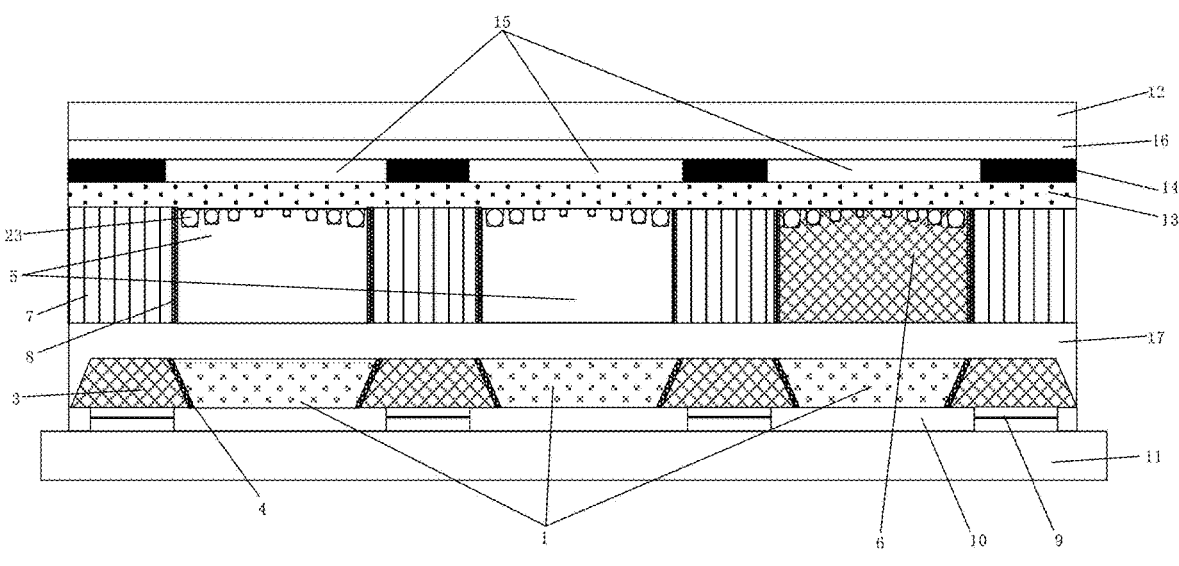
FIGS. 13 and 14 schematically show schematic structural diagrams of another two types of the display panels.
Figure 14:
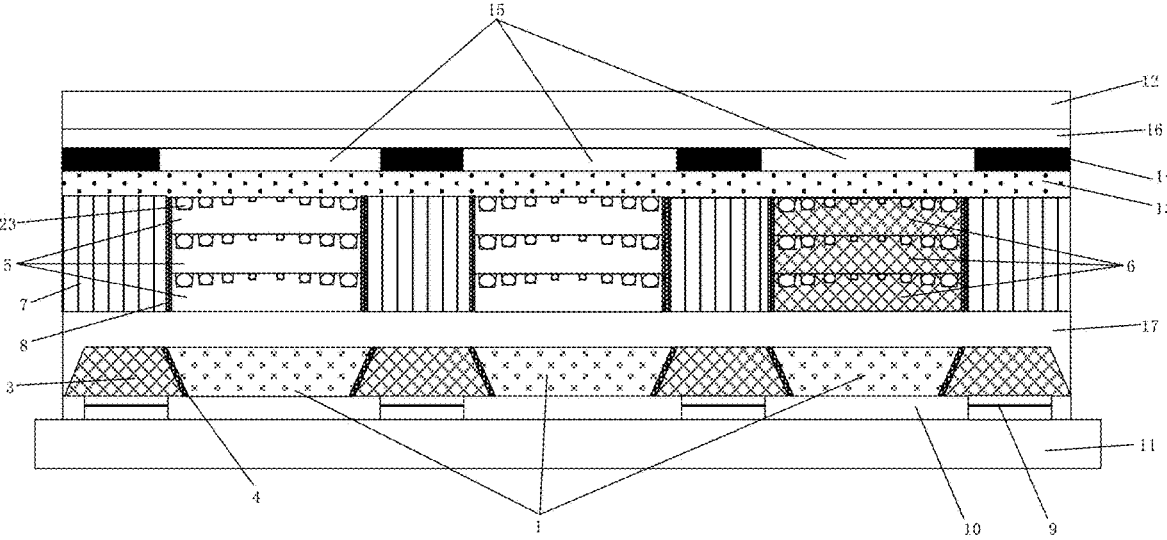

Referring to FIGS. 13 and 14, the quantum-dot color converting units 5 and the transmitting units 6 are further configured to be used as the matrixes of the corresponding scattering components. The scattering particles 23 are arranged on the sides of the quantum-dot color converting units 5 and the transmitting units 6 that are away from the light emitting units 1.

Accordingly, the quantum-dot color converting units and the corresponding scattering particles are integrated together, and the transmitting units and the corresponding scattering particles are integrated together, whereby it is not required to dispose a matrix additionally, which facilitates to save the material and the cost. Moreover, the scattering particles may modulate the light rays emitted out of the quantum-dot color converting units or the transmitting units, so that the light rays may be converged to the center to the largest extent, thereby increasing the light output rate and the direct-visual-angle light emission.

Further optionally, referring to FIG. 14, in order to further increase the light output rate, in the plurality of light emitting units, any one of some of the light emitting units 1 is correspondingly provided with the plurality of quantum-dot color converting units 5, and any one of the other light emitting units 1 is correspondingly provided with the plurality of transmitting units 6.

Referring to FIG. 14, the scattering particles 23 are arranged on all of the sides of the quantum-dot color converting units 5 and the transmitting units 6 that are away from the light emitting units 1. Along the light exiting direction of the light emitting unit, the refractive indexes of the plurality of quantum-dot color converting units that correspond to the same one light emitting unit are equal, and the refractive indexes of the plurality of transmitting units that correspond to the same one light emitting unit are equal.

The initial-wave-band lights emitted by the light emitting units, after converted by the quantum-dot color converting units or the transmitting units, are emitted to the scattering particles. The light rays, after modulated for the first time by the scattering particles, re-enter the quantum-dot color converting units or the transmitting units, and, subsequently, are emitted to the scattering particles again, for the modulation for the second time. That process is repeated, so that the light rays are modulated multiple times, which finally greatly increases the luminous efficiency. It should be noted that, in order to modulate the lights emitted by the quantum-dot color converting units and the transmitting units, all of the scattering particles are arranged on the sides of the quantum-dot color converting units and the transmitting units that are away from the light emitting units. Therefore, such a structure is more suitable to be applied to display panels formed by using the On-EL process.

Referring to FIGS. 3-6, the display panel further comprises a color-film layer (comprising color-film units 15). The color-film layer is located between the scattering components and the base plate. The color-film layer comprises a plurality of color-film units 15. The color-film units 15 are configured to transmit the target-wave-band lights emitted by the scattering units, and absorb non-target-wave-band lights.

The color-film units may be red-color color-film units, wherein the red-color color-film units may transmit red light, and absorb the lights of the other wave bands. Alternatively, the color-film units may also be green-color color-film units, wherein the green-color color-film units may transmit green light, and absorb the lights of the other wave bands. Alternatively, the color-film units may also be blue-color color-film units, wherein the blue-color color-film units may transmit blue light, and absorb the lights of the other wave bands. In order to realize color displaying, the plurality of color-film units may include the three types of color-film units of red, green and blue.

It should be noted that, if the display panel is applied to a QD-OLED display panel, the display panel further comprises a plurality of quantum-dot color converting units and a plurality of transmitting units. If the plurality of quantum-dot color converting units are classified into red-color converting units and green-color converting units, and the plurality of transmitting units are blue-color converting units, then the red-color converting units correspond to the red-color color-film units, the green-color converting units correspond to the green-color color-film units, and the blue-color converting units correspond to the blue-color color-film units.

A display panel formed by using the matching process will be provided below. Referring to FIG. 6, the process of producing the display panel may comprise: producing the light emitting units 1 on the substrate 11 to form a first base plate, producing sequentially on the base plate 12 film layers such as the black matrix 14, the color-film layer (comprising the color-film units 15), the scattering components (comprising the scattering units 21), the quantum-dot color converting units 5 and the transmitting units 6 to form a second base plate, and subsequently the first base plate and the second base plate being arranged in align with each other to form the display panel shown in FIG. 6. Certainly, referring to FIG. 6, the display panel comprises the substrate 11, and reflecting electrodes 10, thin-film transistors 9, the light emitting units 1, the defining parts 3, the reflecting parts 4 and a packaging layer 17 that are arranged on the substrate 11. The display panel further comprises the base plate 12, and the black matrix 14, the color-film layer (comprising the color-film units 15), a planarization film 13, padding members 20, defining units 7 and reflecting units 8 that are arranged on the base plate 12. The display panel further comprises first filling layers 19, second filling layers 30 and encircling dams 31. The planarization film may further serve for encapsulation. The planarization film may be a low-stress compact inorganic thin film that is produced by using an ultralow-temperature process ($\leq$100° C.), for example, thin films such as $SiO_x$, $SiN_x$ and $Al_2O_3$. The film-layer thickness of the planarization film is less than 1 μm, for example, less than 0.5 μm, and the refractive index ranges between 1.7 and 2.0, for example, between 1.75 and 1.85.

A display panel formed by using the On-EL process will be provided below. Referring to FIG. 5, the process of producing the display panel may comprise: producing sequentially on the substrate 11 film layers such as the light emitting units 1, the quantum-dot color converting units 5, the scattering components (comprising the scattering units 21), the black matrix 14, the color-film layer (comprising the color-film units 15) and the base plate 12 (used as the cover plate), thereby forming the display panel shown in FIG. 5. Certainly, referring to FIG. 5, the display panel further comprises the defining parts 3 and the reflecting parts 4, and the light emitting units 1 are arranged in the openings formed by the neighboring defining parts 3. The display panel further comprises a packaging layer 17, a reflective polarizer 16, reflecting electrodes 10, thin-film transistors 9, a planarization film 13 and so on. The planarization film may further serve for encapsulation. The planarization film may be a low-stress compact inorganic thin film that is produced by using an ultralow-temperature process ($\leq$100° C.), for example, thin films such as $SiO_x$, $SiN_x$ and $Al_2O_3$. The film-layer thickness of the planarization film 102 is less than 1 μm, for example, less than 0.5 μm, and the refractive index ranges between 1.7 and 2.0, for example, between 1.75 and 1.85.

An embodiment of the present application further provides a display device, wherein the display device comprises the display panel stated above. The display device may be a rigid display device, and may also be a flexible display device (i.e., bendable and foldable), which is not limited herein. Moreover, it may be a QLED display panel, and may also be a QD-OLED display panel, and any products or components having a displaying function that comprise the display panel, such as a television set, a digital camera, a mobile phone and a tablet personal computer. The display device has a high light output rate, intensive direct-visual-angle light emission, and a good effect of displaying.

An embodiment of the present application further provides a method for producing the display panel stated above, wherein the method comprises:

S01: forming the plurality of light emitting units.

S02: forming the plurality of scattering components, wherein the scattering components are disposed on light exiting sides of the light emitting units, each of the scattering components comprises at least one scattering unit, the scattering unit comprises a matrix and a plurality of scattering particles that are disposed on one side of the matrix, and particle sizes of the scattering particles and distances between orthographic projections of the scattering particles on the substrate and a center projection satisfy a relation of positive correlation, wherein the center projection refers to an orthographic projection of a center of each of the light emitting units on the substrate.

The methods of the formation in the step S01 and the step S02 are not limited, and may be particularly determined according to the particular structures of the light emitting units and the scattering components.

The method for producing the scattering units in which the scattering particles are embedded into the matrix will be described below.

Optionally, one side of the matrix comprises a plurality of openings of different depths, and the scattering particles are disposed within the corresponding openings.

The step S02 of forming the plurality of scattering components comprises: S021: forming a matrix film.

The material of the matrix film may be a transmitting thin-film material that may be vapor-deposited. As an example, the matrix material may be vapor-deposited to the predetermined positions by using an FMM (Fine Metal Mask).

S022: ablating a surface of one side of the matrix film by laser interference, to form the matrix having a plurality of openings of different depths and different sizes.

The patterned matrix is produced by using a laser-interference ablating method. Particularly, the interference laser may be formed by using a high-energy laser passing through an interference system, and the laser-interference system is constructed according to the expected pattern and period. The interference light source acts on the surface of the matrix, thereby ablating to obtain a periodic trans-scale micro-sized/nano-sized structural pattern. The nano-sized structure comprises a plurality of depressed features in an array (i.e., the plurality of openings are formed), and each of the depressed features corresponds to one of the nano-sized scattering particles that are subsequently deposited. The diameters and the depths of the depressed features may be regulated by regulating the energy and the operation duration of the laser, thereby forming the plurality of openings of different depths and different sizes. The characteristic dimension of the interference pattern is controllable at 1-10 μm, and the characteristic dimension of the nano-sized scattering particles is controllable at 20-200 nm.

S023: sputtering the scattering particles into the openings.

The patterned scattering-particle layer is produced by magnetron sputtering. Particularly, by using the step S022, by changing the diameters and the depths of those depressed features (i.e., the openings), the selection of the scattering particles of different sizes is realized, wherein the scattering particles of the corresponding sizes may be selected by the depressed features of different sizes. If the sizes of them match, then the scattering particles may be embedded into the openings of the matrix and be fixed to the surface of the matrix, thereby forming the patterned scattering-particle layer.

By repeating S021-S023 multiple times, the plurality of scattering units that are arranged in layer configuration may be formed.

The "one embodiment", "an embodiment" or "one or more embodiments" as used herein means that particular features, structures or characteristics described with reference to an embodiment are included in at least one embodiment of the present application. Moreover, it should be noted that here an example using the wording "in an embodiment" does not necessarily refer to the same one embodiment.

The description provided herein describes many concrete details. However, it may be understood that the embodiments of the present application may be implemented without those concrete details. In some of the embodiments, well-known processes, structures and techniques are not described in detail, so as not to affect the understanding of the description.

Finally, it should be noted that the above embodiments are merely intended to explain the technical solutions of the present application, and not to limit them. Although the present application is explained in detail with reference to the above embodiments, a person skilled in the art should understand that he may still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present application.

The invention claimed is:

1. A display panel, wherein the display panel comprises:
a substrate;
a plurality of light emitting units that are disposed on the substrate and are arranged in an array; and
a plurality of scattering components that are arranged in an array, wherein the scattering components are disposed on light exiting sides of the light emitting units, and each of the scattering components comprises at least one scattering unit, the scattering unit comprises a matrix and a plurality of scattering particles that are disposed on one side of the matrix, and particle sizes of the scattering particles and distances between orthographic projections of the scattering particles on the substrate and a center projection satisfy a relation of positive correlation, wherein the center projection refers to an orthographic projection of a center of each of the light emitting units on the substrate.

2. The display panel according to claim 1, wherein the particle sizes of the scattering particles are D, and the distances between the orthographic projections of the scattering particles on the substrate and the center projection are x, wherein D and x satisfy:

$$f(x, D) = 1 - \exp\left[-\frac{x^2}{2D^2}\right];$$

wherein $f(x,D)$ is a particle-distribution-density function.

3. The display panel according to claim 1, wherein in the scattering unit, the orthographic projections of the plurality of scattering particles on the substrate are distributed in a concentric circle with the center projection as a center.

4. The display panel according to claim 3, wherein among the orthographic projections of the plurality of scattering particles on the substrate, distances between neighboring concentric circles progressively decrease in a direction from close to the center projection to away from the center projection.

5. The display panel according to claim 3, wherein in the scattering unit, the plurality of scattering particles whose orthographic projections on the substrate are located in a same one circle are equidistantly distributed.

6. The display panel according to claim 1, wherein one side of the matrix comprises a plurality of openings of different depths and different sizes, and the scattering particles are disposed within the corresponding openings.

7. The display panel according to claim 1, wherein in the scattering unit, refractive indexes of the plurality of scattering particles are equal.

8. The display panel according to claim 7, wherein each of the scattering components comprises the plurality of scattering units that are arranged in layer configuration; and along a light exiting direction of the light emitting unit, the refractive indexes of the scattering particles of the plurality of scattering units progressively increase.

9. The display panel according to claim 1, wherein each of the scattering components comprises the plurality of scattering units that are arranged in layer configuration; and along a light exiting direction of the light emitting unit, refractive indexes of the matrixes of the plurality of scattering units progressively increase.

10. The display panel according to claim 1, wherein the display panel further comprises a plurality of reflecting parts and a plurality of defining parts, the defining parts are arranged between neighboring light emitting units, and the reflecting parts are arranged on at least sides of the defining parts that contact the light emitting units.

11. The display panel according to claim 1, wherein each of the light emitting units comprises a quantum-dot luminescent layer.

12. The display panel according to claim 1, wherein the plurality of light emitting units are configured to emit a same initial-wave-band light; and the display panel further comprises a plurality of quantum-dot color converting units, and the quantum-dot color converting units are arranged on light exiting sides of the light emitting units, and are configured to convert the incident initial-wave-band light into a target-wave-band light.

13. The display panel according to claim 12, wherein the display panel further comprises a plurality of transmitting units, and the transmitting units are arranged on the light exiting sides of the light emitting units, and are configured not to change a wave band of the incident initial-wave-band light; and the quantum-dot color converting units and the transmitting units correspond to different light emitting units.

14. The display panel according to claim 13, wherein the quantum-dot color converting units and the transmitting units are arranged between corresponding light emitting units and corresponding scattering components.

15. The display panel according to claim 14, wherein each of the scattering components comprises the plurality of scattering units that are arranged in layer configuration; and along a light exiting direction of the light emitting unit, refractive indexes of the matrixes of the plurality of scattering units progressively increase.

16. The display panel according to claim 13, wherein the quantum-dot color converting units and the transmitting units are further configured to be used as the matrixes of the corresponding scattering components; and the scattering particles are arranged on sides of the quantum-dot color converting units and the transmitting units that are away from the light emitting units.

17. The display panel according to claim 16, wherein in the plurality of light emitting units, any one of some of the light emitting units is correspondingly provided with the plurality of quantum-dot color converting units, and any one of the other light emitting units is correspondingly provided with the plurality of transmitting units;

the scattering particles are arranged on the sides of the quantum-dot color converting units and the transmitting units that are away from the light emitting units; and along a light exiting direction of the light emitting unit, refractive indexes of the plurality of quantum-dot color converting units that correspond to the same one light emitting unit are equal, and refractive indexes of the plurality of transmitting units that correspond to the same one light emitting unit are equal.

18. A display device, wherein the display device comprises the display panel according to claim 1.

19. A method for producing the display panel according to claim 1, wherein the method comprises:

forming the plurality of light emitting units; and forming the plurality of scattering components, wherein the scattering components are disposed on light exiting sides of the light emitting units, each of the scattering components comprises at least one scattering unit, the scattering unit comprises a matrix and a plurality of scattering particles that are disposed on one side of the matrix, and particle sizes of the scattering particles and distances between orthographic projections of the scattering particles on the substrate and a center projection satisfy a relation of positive correlation, wherein the center projection refers to an orthographic projection of a center of each of the light emitting units on the substrate.

20. The method according to claim 19, wherein one side of the matrix comprises a plurality of openings of different depths, and the scattering particles are disposed within the corresponding openings; and the step of forming the plurality of scattering components comprises:

forming a matrix film;

ablating a surface of one side of the matrix film by laser interference, to form the matrix having a plurality of openings of different depths and different sizes; and sputtering the scattering particles into the openings.

* * * * *